United States Patent [19]

Schreiber et al.

[11] Patent Number: 5,340,296
[45] Date of Patent: Aug. 23, 1994

[54] RESILIENT INTERCONNECTION BRIDGE

[75] Inventors: Christopher M. Schreiber, Newport Beach; William R. Crumly, Anaheim, both of Calif.

[73] Assignee: Hughes Aircraft Company, Los Angeles, Calif.

[21] Appl. No.: 108,870

[22] Filed: Aug. 18, 1993

Related U.S. Application Data

[62] Division of Ser. No. 919,472, Jul. 24, 1992, Pat. No. 5,261,158, which is a division of Ser. No. 643,310, Jan. 22, 1991, Pat. No. 5,180,311.

[51] Int. Cl.$^5$ .................. B29C 33/56; B29C 39/10; B29C 39/26; B29C 41/42
[52] U.S. Cl. .................. 425/123; 425/403.1; 249/114.1; 249/115; 249/134; 249/135
[58] Field of Search .................. 249/112, 114.1, 115, 249/134, 135; 425/403.1, 117, 123

[56] References Cited

U.S. PATENT DOCUMENTS

| | | | |
|---|---|---|---|
| 3,761,047 | 9/1973 | Mao | 249/115 |
| 3,780,978 | 12/1973 | Proul | 249/115 |
| 4,004,774 | 1/1977 | Houston | 249/119.1 |
| 4,116,517 | 9/1978 | Selvin et al. | 339/17 F |
| 4,125,310 | 11/1978 | Reardon | 339/92 M |
| 4,453,795 | 6/1984 | Moulin | 339/92 M |
| 4,813,129 | 3/1989 | Karnezos | 29/832 |
| 4,848,719 | 7/1989 | Gowinner | 249/115 |
| 4,919,388 | 4/1990 | Koike et al. | 249/115 |
| 5,197,184 | 3/1993 | Crumly et al. | 29/846 |
| 5,233,157 | 8/1993 | Schreiber et al. | 219/121.68 |

Primary Examiner—Khanh Nguyen
Attorney, Agent, or Firm—Elizabeth E. Leitereg; Terje Gudmestad; W. K. Denson-Low

[57] ABSTRACT

An elastomeric member is incorporated between a conductor and a conductive interconnection bridge. This elastomeric member serves as a spring providing compliance to an interconnection so that the flatness requirements of an opposing mating structure may be relaxed. A flat metal mandrel is provided with an elongated curved depression extending across a predetermined region where a resilient interconnection bridge is to be located. A nonconductive layer of Teflon is bonded to the surface of the mandrel. Grooves are ablated in a predetermined configuration down to the conductive surface of the mandrel using an excimer laser and a computer-controlled x-y table. Fineline electrical circuits are electrodeposited into the ablated grooves. The elongated curved depression is filled with a silicone material. The silicone material is permitted to cure to form a compliant elastomeric member having the shape of the elongated curved depression. An insulating backing is laminated onto the electrical circuits and the elastomeric member, and the completed resilient interconnection bridge is removed from the mandrel. Another method is used when the interconnection site is terminated on a circuit pad or on a high density linear connector configuration. In this method, elastomeric material is dispensed onto the circuit pad or along a line transverse to the high density linear connectors. After the elastomeric material has cured, electrical conductors are bonded thereacross to form raised compliant interconnection features.

2 Claims, 3 Drawing Sheets

Fig. 8.
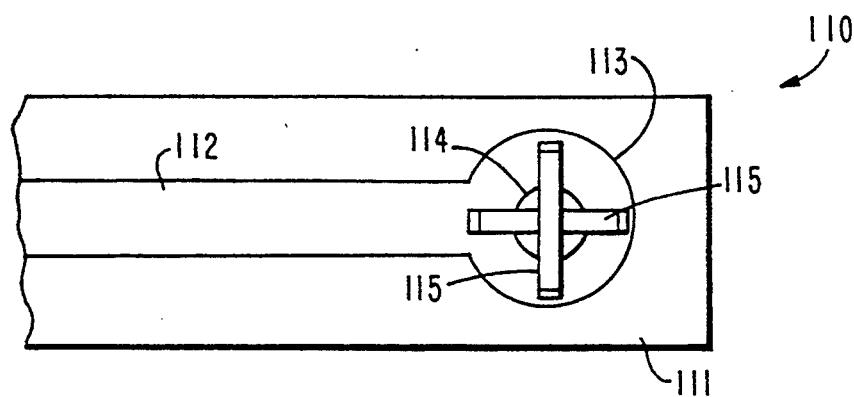
Fig. 9.
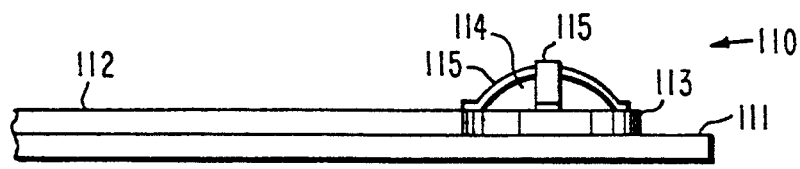
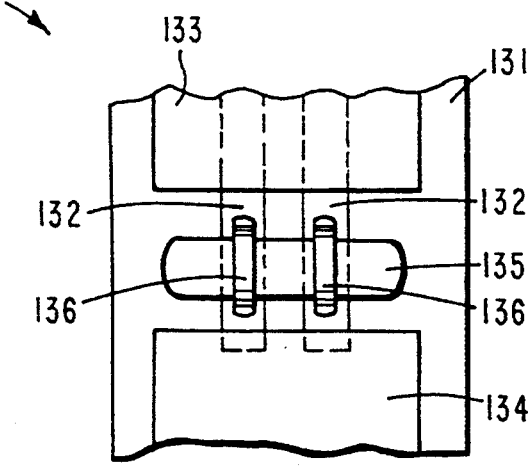
Fig. 10.
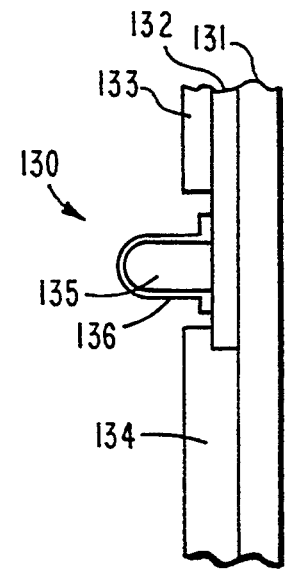
Fig. 11.
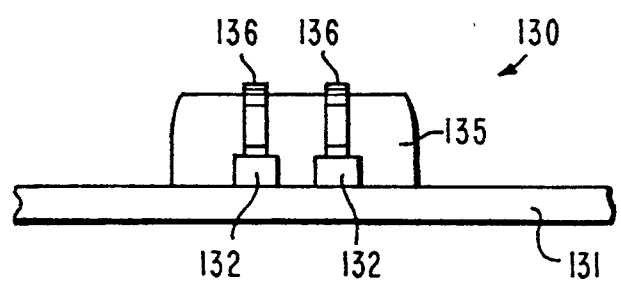
Fig. 12.

RESILIENT INTERCONNECTION BRIDGE

This is a division of application Ser. No. 919,472, filed Jul. 24, 1992, now U.S. Pat. No. 5,261,158, which was a division of application Ser. No. 643,310, filed Jan. 22, 1991, now U.S. Pat. No. 5,180,311.

CROSS-REFERENCE TO RELATED APPLICATIONS

Cross-reference is hereby made to the following related patent applications assigned to the assignee of the present patent application: Ser. No. 580,758, filed Sep. 11, 1990 now U.S. Pat. No. 5,197,184, for Three Dimensional Electroformed Circuitry, by Crumly, Schreiber and Feigenbaum; and Ser. No. 580,749, filed Sep. 11, 1990 now U.S. Pat. No. 5,233,157, for Laser Pattern Ablation of Fineline Circuitry Masters, by Crumly and Schreiber.

BACKGROUND

The present invention relates to connecting devices for high density multichip hybrid integrated circuit boards and, more particularly, to a method of making fineline flexible circuits for interconnecting miniaturized fine pitch connectors.

In todays miniaturized high-density multichip hybrid integrated circuit boards plug and socket connecting devices are no longer used. Instead, fineline flexible circuits having raised surface features such as bumps or dots are clamped in electrical contact with fine pitch etched circuit traces on the circuit boards. Interconnection systems of this type are described in U.S. Pat. No. 4,125,310 to Patrick A. Reardon, II; U.S. Pat. No. 4,116,517 to Selvane, et al.; and U.S. Pat. No. 4,453,795 to Moulin. The connectors of these patents have a plurality of metallic raised features that protrude or project from the plane of the circuit conductors. These raised features may be pressed against either similar raised features or mating conductive connecting pads or etched circuit traces on a circuit board. The two circuits may be physically clamped together to press the features against one another thereby making firm and intimate electrical contact between the two circuits. Such interconnects typically employ 0.003 inch diameter features on flexible circuits that connect to 0.005 inch wide etched circuit traces on the circuit boards. The interconnect density may be as high as 2800 interconnects per square inch.

Multilayer printed circuit boards often have an uneven or irregular surface in the region where the etched circuit traces are located. To make reliable connection, more stringent flatness requirements are required for the circuit board, or the complexity and weight of the clamping structure is increased to force a better connection between the wires in the flexible circuit and the etched traces on the printed circuit board. However, higher pressure exerted by the clamping structure tends to damage the substrate or to distort the flexible circuit so that the wires "swim" and registration of the fine pitch connections is lost.

Accordingly, it is an objective of the present invention to provide compliance to a fineline interconnection so that the flatness requirements of the opposing mating structure may be relaxed. Another objective of the present invention is the provision of a low cost, high density compliant interconnection system capable of compensating for device surface irregularities. A further objective of the present invention is to add compliance to any flexible circuit fabricated using conventional methods. A still further objective of the invention is to provide spring compliance to a fineline flexible circuit interconnection that permits reducing complexity and weight of a clamping structure used in conjunction therewith. Yet another objective of the present invention is the provision of an interconnection system that is more reliable, more compact and less costly. Still another objective of the invention is to provide an interconnection system that distributes the force required to make contact, thus reducing the possibility of damage to the substrate.

SUMMARY OF THE INVENTION

In accordance with these and other objectives and features of the invention, an elastomeric member is incorporated between conductors and conductive interconnection bridges that form a high density interconnection system. This elastomeric member serves as a spring and provides compliance to the interconnection so that the flatness requirements of the opposing mating structure may be relaxed.

To provide a compliant elastomeric member to a fineline, high density flexible circuit fabricated by conventional methods, a special mandrel is provided. The mandrel is a flat, rectangular plate made of a metal such as steel. An elongated, curved depression is provided completely across the mandrel in the region where the interconnection bridges are to be formed. Preparatory to building up the flexible circuit, a layer of Teflon is bonded to the surface of the mandrel. The pattern for the flexible circuit is ablated into the surface of the Teflon in a direction orthogonal to the direction of the depression by a sharply focussed laser beam. The pattern for the flexible circuit is cut completely through the layer of Teflon to the surface of the steel mandrel. A pattern of conductors made of a material such as copper is then electroformed, plated or electrodeposited on the mandrel. Then the elongated, curved depression is filled with a material such as silicone, for example RTV. After the RTV has cured, it forms a compliant elastomeric member behind the resilient interconnection bridges formed by the flexible circuit conductors deposited in the elongated curved depression. An insulating backing is then bonded to the flexible circuit, and the completed fineline, high density flexible circuit is removed from the mandrel.

To make a resilient interconnection feature where the interconnection site is located on a circuit pad, the following technique is used. A dollop of elastomeric material is dispensed on the pad. After the elastomeric material has cured, a bonder such as a wire bonder or ribbon bonder made by Hughes Aircraft Company is used to stitch over the compliant elastomeric material. Due to the bonder's ability to attach gold wire, no additional processing such as plating is necessary. The newly-formed interconnection feature is ready to use.

In the case of a high density linear fine pitch connector, a slightly different technique is used. Such fine pitch connectors are needed for surface mount applications, and for terminations similar to card edge connectors. This technique involves the application of elastomeric material dispensed along a line to form a ridge crossing over all of the fine pitch circuit traces. After the elastomeric material has cured, a bonder is used to stitch over the compliant elastomeric ridge at each one of the circuit traces.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 8 is a plan view of a resilient interconnection feature formed on an existing circuit pad;

FIG. 9 is a side view of the resilient interconnection feature of FIG. 8;

FIG. 10 is a plan view of a plurality of resilient interconnection features formed on an existing high density, linear, fine pitch connector;

FIG. 11 is a side view of the resilient interconnection features formed on the linear connector of FIG. 10; and FIG. 12 is a front view of the resilient interconnection features formed on the linear connector of FIG. 10.

DETAILED DESCRIPTION

Typically, multilayer printed circuit boards may have an irregular surface along which is disposed a high density linear interconnect. A clamping structure is adapted to force the linear interconnects into electrical contact with flexible circuits. Flexible circuits in accordance with the invention are used to reduce the complexity and weight of the clamping structure, resulting in an interconnect system that is more reliable, more compact and less costly. It also reduces and distributes the force required to make contact, in turn reducing the possibility of damage to the interconnection system.

Figure 1:
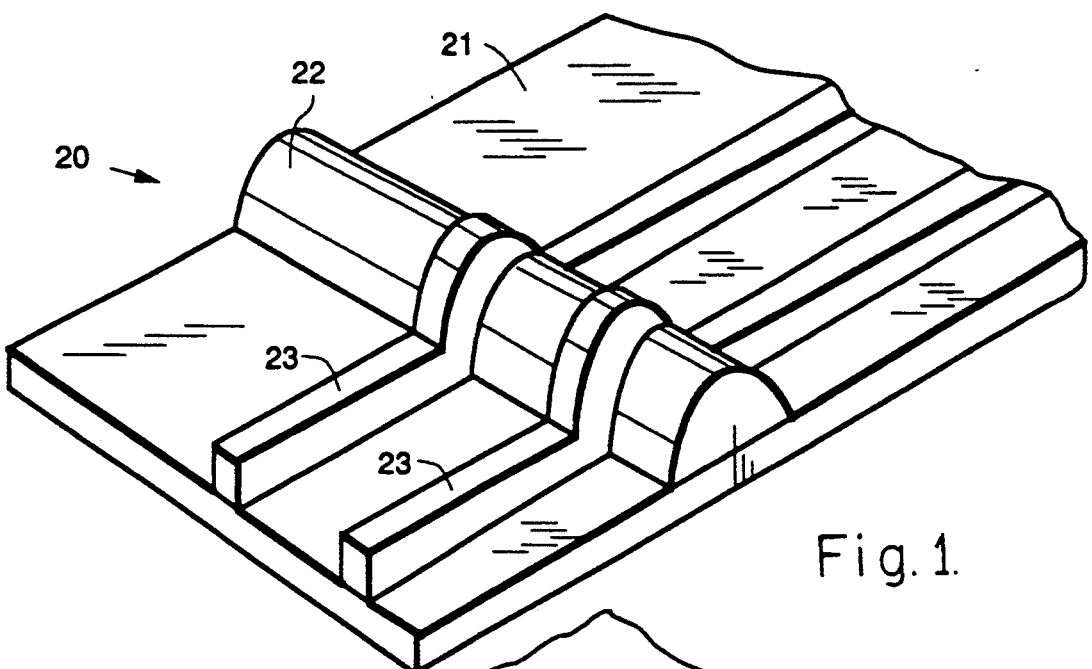
FIG. 1 is a fragmentary perspective view of a portion of a resilient interconnection bridge constructed in accordance with the principles of the present invention.

FIG. 1 is an enlarged, partly broken away perspective view of a portion of a resilient interconnection bridge 20 constructed in accordance with the principles of the present invention. The interconnection bridge 20 comprises a flexible substrate or insulating backing 21, a resilient elastomeric member 22 fastened to the backing 21, and a plurality of flexible circuit conductors 23 extending along the surface thereof. Although only two conductors 23 are shown in the fragmentary view of FIG. 1, a typical resilient interconnection bridge 20 might have several hundred fineline, high density close pitch flexible circuit conductors 23. For example, there might be 269 conductors 0.005 inch wide, each having a 0.005 inch space between conductors so that a 0.01 inch pitch is achieved. The elastomeric member 22 in conjunction with the flexible circuit conductors 23 takes the place of the raised features such as dots or bumps that are used in conventional interconnection systems. The elastomeric member 22 serves as a spring providing compliance to the interconnection so that the flatness requirements of the opposing mating structure may be relaxed.

Flexible circuits similar to the resilient interconnection bridge 20 shown in FIG. 1 are usually made by photolithographic and etching processes using print and etch techniques. Conventional steps employed in such processes include covering a dielectric substrate with a layer of conductive material, and coating the conductive layer with a photosensitive etch resist. A mask having a pattern of opaque and transparent portions is applied over the resist and exposed to light. The resist is developed to leave a pattern corresponding to the mask, and then the conductive material is subjected to an etchant bath. The developed resist is then stripped leaving the desired pattern of conductive circuit traces on the surface of the substrate.

It is a feature of the present invention that the foregoing conventional processes are not used. Conventional photolithographic or etching processes require an expensive class 10,000 clean room for environmental control. Furthermore, etching processes require an excessive number of process steps and produce undercutting that results in conductors that do not have a precisely rectangular cross section.

Figure 2:
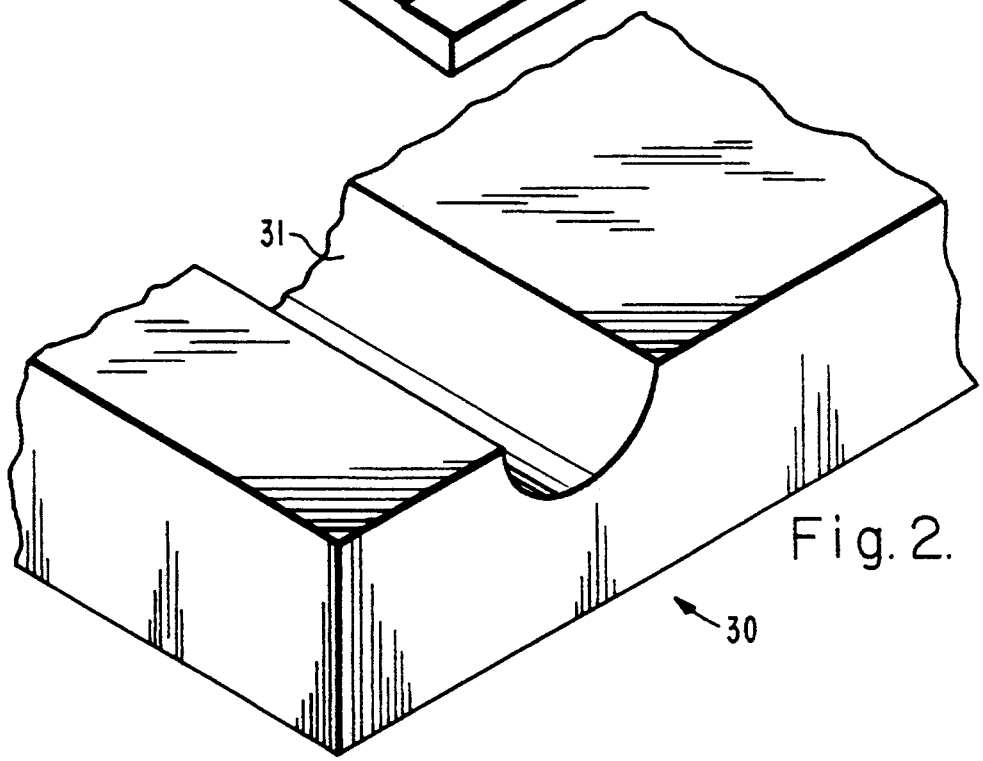
FIG. 2 is a fragmentary perspective view of a portion of a mandrel used to make the interconnection bridge of FIG. 1.
Figure 3:
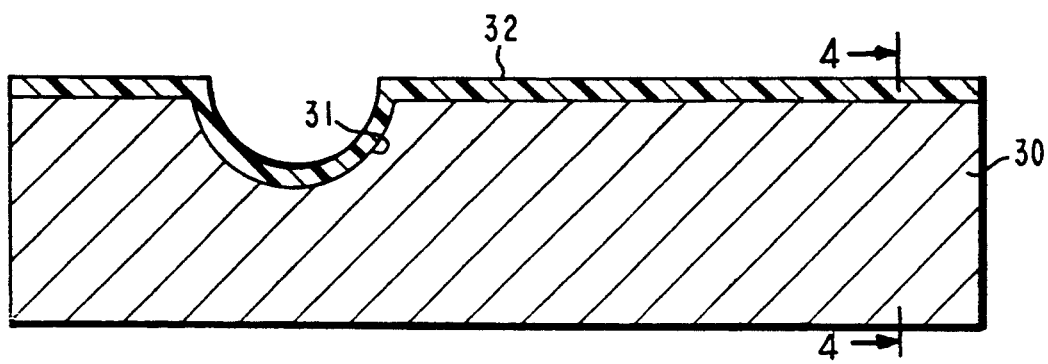
FIG. 3 is a side view of the mandrel of FIG. 2 showing a layer of a nonconductive material bonded to the surface thereof.

FIG. 2 is a fragmentary perspective view of a mandrel 30 for making the resilient interconnection bridge 20 of the present invention by a building-up process rather than by an etching away process. The mandrel 30 is a flat rectangular plate made of a metal such as steel. An elongated curved depression 31 is provided that extends completely across the mandrel 30 in the region where the interconnection bridges are to be formed. FIG. 3 shows a side view of the steel mandrel 30. The mandrel 30 is polished to a very smooth finish such as a 4 m finish, and a coating of a suitable nonconductive material 32 such as, for example, Teflon, is applied and bonded to the surface thereof. The thickness of the nonconductive material 32 is selected or predetermined to be equal to the height of the flexible circuit conductors 23 (see FIG. 1). Thereafter, a pattern of grooves is formed in the nonconductive material 32 by ablation using a sharply focussed beam from a laser. Typically, the laser is mounted above a work table that is movable in two dimensions. The mandrel 30 is securely mounted on the table and the laser beam is focussed on the nonconductive material 32. The table is driven in the desired pattern by computer-controlled motors.

The laser employed is typically an excimer laser emitting pulses at a wavelength of 248 nanometers having a duration of a few nanoseconds each. The laser is focussed to provide a substantially parallel beam of exceedingly small dimensions at the surface of the nonconductive material 32. Typically, the laser can be focussed to a spot as small as one-half mil in diameter. Accordingly, the laser is capable of ablating the nonconductive material 32 to form grooves having a width of several mils or less, and as small as one-half mil. The grooves ablated by the laser extend entirely through the nonconductive material 32 to expose the conductive surface of the steel mandrel 30. The depth of the ablated grooves is determined by the thickness of the nonconductive coating 32 which, in turn, depends on the desired predetermined thickness of the flexible circuit conductors 23. The thickness of the nonconductive coating 32 may be readily increased or decreased, if desired.

Having completed the computer-controlled x-y traverse of the ablating laser beam, the nonconductive material 32 has a desired pattern of grooves with walls substantially perpendicular to the exposed conductive surface of the steel mandrel 30. The walls of the grooves are parallel to one another and to the axis of the laser beam which is perpendicular to the surface of the mandrel 30. Accordingly, the grooves in the nonconductive material 32 are of rectangular configuration, and of precisely predetermined dimensions with high resolution.

If deemed necessary or desirable, the exposed surface of the mandrel 30 at the bottom of the grooves may now be treated to promote release of the circuit conductors 23 that are to be additively electroformed in the grooves. As to the surface of the nonconductive material 32, no preparation to promote release is necessary. If the nonconductive material 32 is a material such as Teflon, or the like, the surface of the nonconductive material 32 itself provides for ready release of an insulating backing 21 that is to be laminated thereon. However, if deemed necessary or desirable, the surface of the nonconductive material 32 may be treated to promote such release.

Figure 4:
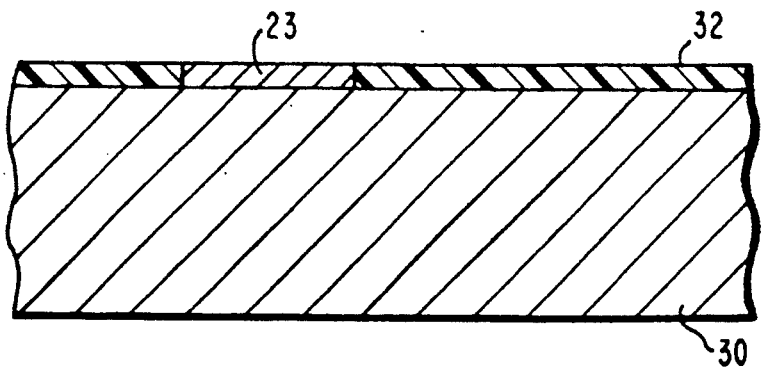
FIG. 4 is a cross-sectional view of the mandrel of FIG. 3 taken along the lines 4—4 of FIG. 3.

FIG. 4 is a fragmentary cross-sectional view taken along the lines 4—4 of FIG. 3, showing one of the grooves in the nonconductive material 32 filled with a conductive material to form one of the flexible circuit conductors 23. This electrically conductive material may be copper or nickel, or the like. The conductive material fills all of the grooves made by laser ablation to form a predetermined conductive pattern of flexible circuit conductors 23 as indicated in FIG. 1. The conductive material is applied by an additive process such as electrolytic deposition, electroless, electrophoretic or electrostatic deposition, or the like. If deemed necessary or desirable, the exposed surface of the flexible circuit conductors 23 may be suitably treated to promote bonding to the elastomeric member 22 and the flexible substrate or insulating backing 21 that are to be built up thereon.

Figure 5:
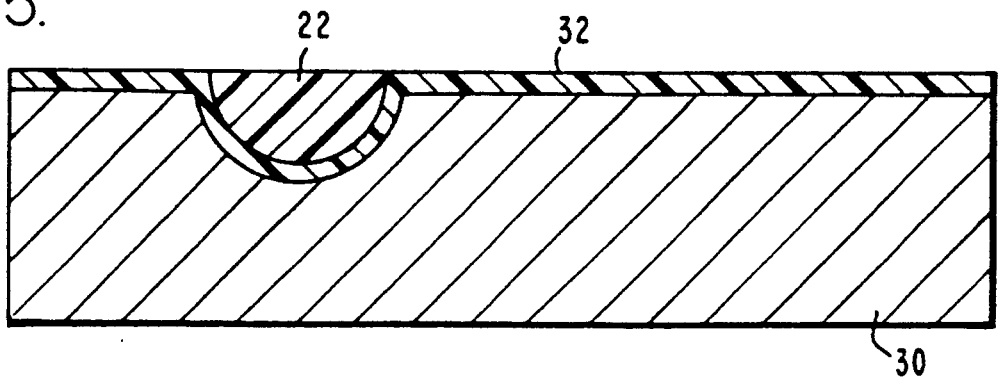
FIG. 5 is a side view of the mandrel of FIGS. 2, 3 and 4 showing a resilient elastomeric member formed in a depression in the surface thereof.
Figure 6:
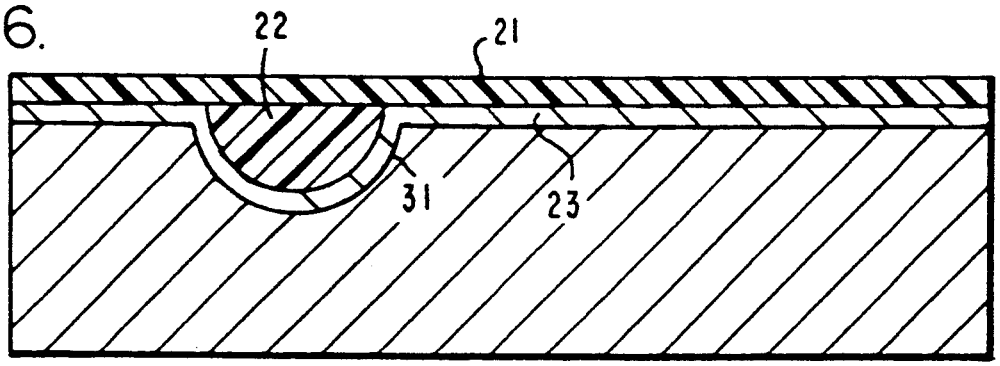
FIG. 6 is a side view of the mandrel of FIGS. 2, 3, 4 and 5 showing a flexible substrate or insulating backing built up thereon.

Referring now to FIG. 5, which is a side view of the mandrel 30 as in FIG. 3, after the flexible circuit conductors 23 have been formed by filling the grooves with a conductive material, the elongated curved depression 31 is filled with a resilient elastomeric material such as silicone, RTV for example. This elastomeric material is allowed to cure to form the elastomeric member 22 shown in FIG. 1. The elastomeric member 22 provides a springy elasticity behind the interconnection bridge 20 formed by the flexible circuit conductors 23 deposited or plated in all grooves traversing the elongated curved depression 31. Referring to FIG. 6, the flexible substrate or insulating backing 21 is bonded to the flexible circuit conductors 23 and to the resilient elastomeric member 22. The insulating backing 21 may be formed of any one of a number of suitable materials. These include polyimide, polyimide layered acrylic adhesive, polyethylene, polyester and vinyl. One example of an insulating backing 21 that has been found satisfactory comprises a one mil layer of a polyimide covered with a one or two mil layer of acrylic adhesive. The insulating backing 21 is bonded to the elastomeric member 22 and the deposited or plated circuit conductors 23 under a pressure of about 300 psi. and at a temperature of about 370 degrees Fahrenheit. At this pressure and temperature, the insulating backing 21 flows and enters the microstructure in the deposited or plated circuit conductors 23 which insures its adhesion thereto.

Figure 7:
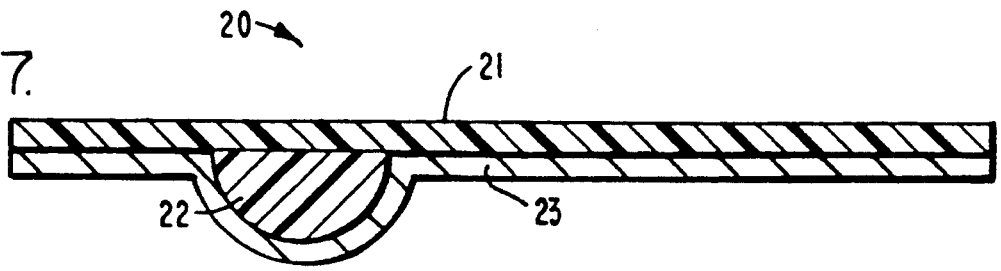
FIG. 7 is a side view of the resilient interconnection bridge of FIG. 1 after it has been removed from the mandrel of FIGS. 2-6.

FIG. 7 shows the completed resilient interconnection bridge 20. A knife edge or the like is inserted between the insulating backing 21 and the nonconductive material 32 to lift the insulating backing 21 together with the resilient elastomeric member 22 and the flexible circuit conductors 23. The resulting resilient interconnection bridge 20 comprises the flexible substrate or insulating backing 21 and resilient elastomeric member 22 on the surface of which is formed and bonded a pattern of fineline, high density, close pitch flexible electrical conductors 23. The elastomeric member 22 protrudes to form, along with the conductors 23 that traverse it, a raised interconnection feature.

It will be understood that the mandrel 30 is reusable and can be used to make as many of the resilient interconnection bridges 20 as desired. The reusable master or mandrel 30 enables manufacture of electrical circuitry by fully additive electrodeposition processes, allows more precise control of placement dimensions of conductive traces or circuits, and completely eliminates conventional photoetching and stripping operations. By eliminating photo-developing, etching and stripping operations, the hereindescribed additive processes require many fewer process steps. As a result, costs of manufacture are dramatically reduced and speed of production increased. The hereinabove described method is efficient and provides a circuit free from inherent distortions found in circuits produced by etching. Conventional subtractive processes have a thermal coefficient of expansion mismatch between dielectric and copper that is etched away. Furthermore, environmental control is not as critical as in photolithographic or etching processes. The additive process described hereinabove produces circuit features in a relatively inexpensive, easy to maintain plating shop environment. Photolithographic processes, on the other hand, require an expensive class 10,000 clean room.

The process described herein controls the configuration of the electrical circuit by computer-controlled x-y positioning of the mandrel beneath a laser beam. Accordingly, the configuration of the electrical circuitry can be readily changed to provide a different pattern and a different circuit by merely changing the computer software. In the photolithographic method, on the other hand, it is necessary to design and manufacture new artwork, and new masks.

Referring now to FIGS. 8 and 9 of the drawings, there is shown a plan view and side view, respectively, of one embodiment of a resilient interconnection feature 110 formed on an existing circuit pad 113. FIGS. 8 and 9 show a substrate 111 made of a suitable insulating material such as polyimide. On the substrate 111 is a conductive circuit trace 112 which may be made of copper, for example, and which terminates in a circuit pad 113. In making the resilient interconnection feature 110, first an elastomer is dispensed on the pad 113 to form an elastomeric dollop. The elastomer may be made of silicone, and may be a product such as RTV. The elastomer is permitted to cure to form an elastomeric member 114 which serves as a spring and provides compliance to the resilient interconnection feature 110. After the elastomeric member 114 has cured, gold wires 115 are stitched over the compliant elastomeric member 114 to form a bridge in two planes. A wire or ribbon bonder of the type manufactured by Hughes Aircraft Co. may be employed to bond the gold wires 115. Due to the bonder's ability to attach the gold wire 115, no further processing such as plating is required, and the resilient interconnection feature 110 is ready to use. The invention may be employed with any flexible circuit fabricated using conventional methods.

Referring now to FIGS. 10, 11 and 12 of the drawings, there is shown a plurality of interconnection features formed on an existing high density, linear, fine pitch connector 130. FIG. 10 shows a plan view, FIG. 11 shows a side view, and FIG. 12 shows a front view. This embodiment of the linear fine pitch connector 130 is exemplary of a high density linear interconnect arrangement. Such arrangements are typically found in surface mount technology or, if folded over, it is representative of arrangements typically found in a card edge connector. FIGS. 10, 11 and 12 show a substrate 131 made of a suitable insulating material such as polyimide, for example. On top of the substrate 131 there are disposed two circuit traces 132 which are made of a conductive material such as copper, for example. A first insulating layer 133 covers a portion of the traces 132, while a second insulating layer 134 covers a different portion of the traces 132. For purposes of clarity, neither one of these insulating layers 133, 134 is shown in FIG. 12. The first and second insulating layers 133, 134 are made of a suitable insulating material such as polyimide, for example.

The first and second insulating layers 133, 134 cover the circuit traces 132 except for a space between the ends of the insulating layers 133, 134 where the traces 132 are exposed. An elongated elastomeric member 135 is disposed transversely across the exposed portion of the circuit traces 132. The elongated elastomeric member 135 is formed by dispensing an elastomer transversely across the exposed portion of the circuit traces 132. The elastomer may be made of silicone, for example, and may be a product such as RTV, for example. The elastomer material is permitted to cure to form the elastomeric member 135 which serves as a spring and provides compliance to the interconnection feature. After the elastomeric member 135 has cured, gold wires 136 are stitched over the compliant elastomeric member 135. A wire or ribbon bonder of the type manufactured by Hughes Aircraft Co. may be employed to bond the gold wires 136. Due to the bonders' ability to attach the gold wires 136, no further processing such as plating is required, and the interconnection feature is ready to use.

A novel feature of this invention is the presence of an elastomeric member incorporated between the conductor and conductive interconnection bridge. This elastomer serves as a spring providing compliance to the interconnection so that the flatness requirements of the opposing mating structure may be relaxed. This is a desirable feature when attempting to mate to multilayer PC boards which often have an irregular surface. The described invention provides a high density interconnection system with an integral spring.

The present invention reduces the complexity and weight of the clamping structure, resulting in an interconnect system that is more reliable, more compact and less costly. It also reduces and distributes the force required to make contact, in turn reducing the possibility of damage to the substrate.

In practice, the invention has been utilized for bonding 0.003 inch ribbon to a 0.005 inch wide circuit trace. The length of the bridge is approximately 0.025 inches. Given these dimensions, a .01"×.035" pitch is achievable, for an interconnect density of 2800 interconnects per square inch.

Thus there has been described a new and improved resilient interconnection bridge. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. Apparatus for use in manufacture of a resilient interconnection bridge comprising:

a mandrel including a mandrel substrate having a surface formed of a material that accepts electroforming of electrically-conductive circuit traces;

a protective coating of a material resistant to electroforming formed on said mandrel substrate, a pattern of grooves formed in said coating extending through said coating to said mandrel, said grooves having walls that are substantially perpendicular to said mandrel substrate, whereby a pattern of electrical conductors is electroformed upon said mandrel substrate in said grooves, and whereby a dielectric substrate is laminated upon said coating and conductors to enable removal of the dielectric substrate and conductors from the mandrel substrate and its coating; and an elongated curved depression disposed across said mandrel in a predetermined region where a resilient interconnection bridge is to be formed in which a compliant elastomeric member is formed.

2. The apparatus of claim 11 in which said mandrel is reusable, and in which said mandrel comprises a mandrel body having a mandrel surface defined by a first pattern of electrically conductive surface areas separated by a second pattern of electrically nonconductive surface areas, and in which said elongated curved depression is a feature formed in said mandrel at a predetermined region of said electrically conductive surface areas, said elongated curved depression defining a mold, whereby an electrical circuit is electrodeposited upon said mandrel body over said predetermined region, and whereby a compliant elastomeric element is molded thereto to form a raised compliant interconnection feature.

* * * * *